United States Patent
Srinivasan

(10) Patent No.: US 11,221,382 B2
(45) Date of Patent: Jan. 11, 2022

(54) OPTIMIZED INFANT MRI SYSTEM WITH CRYOCOOLED RF COIL

(71) Applicant: Advanced Imaging Research, Inc., Cleveland, OH (US)

(72) Inventor: Ravi Srinivasan, Beachwood, OH (US)

(73) Assignee: Advanced Imaging Research, Inc., Cleveland, OH (US)

( * ) Notice: Subject to any disclaimer, the term of this patent is extended or adjusted under 35 U.S.C. 154(b) by 0 days.

(21) Appl. No.: 16/753,096

(22) PCT Filed: Oct. 5, 2018

(86) PCT No.: PCT/US2018/054551
§ 371 (c)(1),
(2) Date: Apr. 2, 2020

(87) PCT Pub. No.: WO2019/071091
PCT Pub. Date: Apr. 11, 2019

(65) Prior Publication Data
US 2020/0284861 A1    Sep. 10, 2020

Related U.S. Application Data

(60) Provisional application No. 62/569,034, filed on Oct. 6, 2017.

(51) Int. Cl.
*G01R 33/34* (2006.01)
*G01R 33/28* (2006.01)
*G01R 33/341* (2006.01)

(52) U.S. Cl.
CPC ....... *G01R 33/3403* (2013.01); *G01R 33/288* (2013.01); *G01R 33/341* (2013.01)

(58) Field of Classification Search
USPC ......................................... 324/322
See application file for complete search history.

(56) References Cited

U.S. PATENT DOCUMENTS

| 8,410,781 B1 | 4/2013 | Yang et al. | |
| 2005/0062473 A1* | 3/2005 | Ryan | H01F 6/04 324/318 |
| 2011/0006771 A1 | 1/2011 | Randell et al. | |
| 2011/0152670 A1 | 6/2011 | Yang et al. | |

(Continued)

FOREIGN PATENT DOCUMENTS

| WO | WO 2010/104940 A1 | 9/2010 |
| WO | WO 2012/155002 A1 | 11/2012 |
| WO | WO 2014/007817 A1 | 1/2014 |

OTHER PUBLICATIONS

Authelet, G., et al., Conceptual Design of a Cyrogen-Free uMRI Device, 2017 IOP Conf. Ser.: Mater. Sci. Eng. 278 012122 (dated 2017) (Year: 2017).*

(Continued)

*Primary Examiner* — Rodney E Fuller
(74) *Attorney, Agent, or Firm* — Kusner & Jaffe

(57) ABSTRACT

A pediatric magnetic resonance imaging (MRI) system is provided. The pediatric MRI system includes a radio frequency (RF) coil configured to image a portion of a patient. The pediatric MRI system also includes a cryo-cooling mechanism operatively coupled to the RF coil. The cryo-cooling mechanism is configured to maintain a temperature of the RF coil within a prescribed temperature range.

11 Claims, 7 Drawing Sheets

(56) References Cited

U.S. PATENT DOCUMENTS

| | | | |
|---|---|---|---|
| 2013/0203603 A1* | 8/2013 | Harrison | H01F 6/04 |
| | | | 505/162 |
| 2013/0278262 A1 | 10/2013 | Zhai et al. | |
| 2015/0226817 A1* | 8/2015 | Pourrahimi | G01R 33/3815 |
| | | | 324/309 |
| 2017/0261574 A1* | 9/2017 | Stainsby | H01F 6/008 |
| 2017/0328968 A1* | 11/2017 | Wikus | F17C 3/085 |
| 2018/0045796 A1* | 2/2018 | Schauwecker | G01R 33/34023 |
| 2018/0045797 A1* | 2/2018 | Hinderer | G01R 33/3815 |
| 2018/0064365 A1* | 3/2018 | Srinivasan | A61B 5/055 |
| 2020/0081053 A1* | 3/2020 | Kim | G01R 33/072 |
| 2020/0096581 A1* | 3/2020 | Pourrahimi | G01R 33/3815 |
| 2020/0209329 A1* | 7/2020 | Authelet | H01F 6/06 |
| 2020/0275859 A1* | 9/2020 | Srinivasan | G01R 33/3804 |

OTHER PUBLICATIONS

International Search Report from corresponding International Patent Application No. PCT/US2018/054551, dated Jan. 21, 2019.

\* cited by examiner

OPTIMIZED INFANT MRI SYSTEM WITH CRYOCOOLED RF COIL

RELATED APPLICATION DATA

The present application claims priority to U.S. Provisional Application No. 62/569,034, filed on Oct. 6, 2017, which is incorporated by reference in its entirety.

TECHNICAL FIELD

The present invention relates to an optimized magnetic resonance system, and to advances in magnet, gradient, and radio-frequency coil technologies. More particularly, the present application is directed toward a diagnostic magnetic resonance imaging system for infants.

BACKGROUND OF THE INVENTION

Roughly 1 in 10 newborns are born premature. Early diagnosis of potential injury or disease in premature infants can lead to early intervention which in turn can save lives. Magnetic resonance imaging (MRI) is a safe, non-ionizing radiation-based diagnostic imaging tool that is routinely used in the characterization of illnesses in the first few hours of life.

Newborns that need special care are typically placed in a specialized area, such as an intensive care unit (ICU) or neonatal intensive care unit (NICU) within a hospital. Infants in an ICU/NICU are typically required to stabilize prior to initiating an MRI study, which traditionally involves leaving the ICU/NICU. Such stabilization can take days or even weeks, by which time an injury or disease may manifest, and in some cases may become irreversible, leaving very little or no room for clinical intervention. Furthermore, MRI rooms are not designed to be receptive to infants who struggle to maintain normothermia. Instead, conventional MRI rooms are maintained at lower temperatures to prevent a patient's core body temperature from exceeding the FDA limit of 1° C., which although suitable for adults, is not tolerated by pre-term and term infants. Accordingly, sick infants often lose body temperature during transport from the ICU/NICU and during the MRI procedure, which can be deleterious to their health. Additionally, conventional adult scanners with adult sized imaging devices, when used on infants, compromise image quality and prolong scanner times, which are not tolerated by infants or the clinical staff. Ill infants may require on-the-spot (stat) diagnosis. For all of these reasons, it may be beneficial to have an MRI system in the clinical department, for example within the ICU.

When using MRI systems to diagnose a patient, effective diagnosis depends on MRI quality. Conventionally, high-field magnets are preferred to obtain high signal to noise ratio (SNR) and therefore high image resolutions on small anatomy. Current high field magnet technology employ dual vacuum chambers for helium and nitrogen gas used to maintain superconductivity of the current carrying wire(s), and therefore the resulting main magnetic field. Slight variation in magnet temperatures, however, can trigger an undesirable quench, and a rapidly quenching magnet may produce unnecessary vibration and excessive noise. Additionally, the sudden release of large amounts of helium during a magnet quench may deprive the patient and healthcare personnel of oxygen. Moreover, these undesirable magnet quenches may result in considerable MRI downtime and are expensive to correct. Furthermore, stronger and faster switching time varying gradients normally kept outside the magnet structure can also cause eddy current artifacts in the MRI image, especially on higher resolution and faster scans.

Accordingly, heating due to vibration, coil resistance and eddy currents may be significant. For example, without considering sinusoidal functions, the resistive heat generated from driving one gradient set with 25 ms) internal resistance at 150 A is about 563 W. Considering the cumulative effect of multiple axes driven at peak power, this heat generation is significant. Magnet winding coils are conventionally cooled and housed in two vacuum chambers (one for helium and one for nitrogen; not shown) for isolation from the ambient room temperature. A water cooling mixture may be used to reduce the resistive heat generated by the epoxy-potted, fast switching 0.1-10 KHz gradients (typical inductance in the order of 10-100 mH). However, this typically requires a dedicated source and a means of quickly absorbing the generated heat. Heating due to vibration, coil resistance and eddy currents may also be minimized by eliminating a metal enclosure between the gradients and the main magnet while embedding it in a super-cooled enclosure.

Due to their small size, an infant, when scanned using a conventional adult-sized MRI, is immediately subjected to low IEC/FDA limits for whole body heating since their entire body fits inside the body coil. The IEC/FDA limits are known in the art and are generally as follows:

IEC/FDA Limits for Whole Body Heating
  Normal mode limit (suitable for all patients)—0.5 degrees C. or 2 W/kg
  First level controlled mode (medical supervision)—1.0 degrees C. or 4 W/kg
  Second level controlled mode—greater than 1 degree C. or 4 W/kg (requires IRB approval)
IEC/FDA Limits for Localized Heating
  Head normal mode limit—38 degrees C. or 3.2 W/kg averaged over head mass
  Torso normal mode limit—39 degrees C. or 10 W/kg over any 10 grams
  Extremities normal mode limit—40 degrees C. or 10 W/kg over any 10 grams
  No first level for head, torso or extremities.

Larger adult body RF coils, normally tuned for an average adult patient weight (e.g., 170 lbs), experience unloaded conditions with the small infant load (e.g., ≤10 lbs) and therefore expend a majority of their power into a 50Ω termination load. Incident radio frequency (RF) powers, if not terminated properly, result in a standing-wave which impedes proper measurement and therefore RF transmit chain calibration. At very low RF powers, system measurements and specific absorption rate (SAR) algorithms may not be accurate. That is, a system with a 35 kW RF amplifier has difficulty with calibration at ≤5% of its maximum rating (≤1.75 kW), often leading to ambiguous results and, in some cases, termination of the scan (for e.g., when SAR≥100%).

Larger adult receiver RF coils used to obtain images from infants have a very low filling factor ($\eta$, defined as loading volume divided by the coil volume) and therefore are not optimum for use with infants, since SNR is proportional to $\eta$ (i.e., SNR $\alpha$ $\eta$). This is also true when imaging devices are placed around a warming therapy device (e.g., within an isolette). Conventional pediatric coils accommodate 2-year-old patients weighing 23 Kgs, but are not suited for infants weighing anywhere between 450 grams to 4.5 kilograms. Custom infant sized imaging devices are preferred to acquire optimum quality images preferably in a shorter exam.

SUMMARY OF THE INVENTION

MRI SNR depends on several parameters such as the operating frequency (f), signal strength induced in the RF coil and coil quality factor Q which in turn depends on the coil and sample resistances. The operating frequency depends on the field strength ($\omega=2\pi f=\gamma B_0$), where $\gamma$ is the gyromagnetic ratio for protons and f is the operating frequency in MHz and $\omega$ in radians. The operating frequency for MRI protons is 64 MHz at 1.5 T and 128 MHz for 3 T. MRI SNR $\alpha(\omega^2 B_1)/\sqrt{r_{coil}+r_{sample}}$, where $\omega$ is the larmor frequency, $B_1$ is the signal induced in the RF coil by a precessing nucleus, $r_{coil}$ and $r_{sample}$ are sample and coil resistances. Coil resistance includes RF coil and associated electronics, whereas sample resistance due to lossy human loading can be expressed as $r_{sample} \alpha \sigma \omega^2 B_1^2 b^5$, where $\sigma$ is the sample conductivity and b is a sphere sample radius seen by the RF coil. As seen, reducing the RF coil size and thereby the sample radius seen by the RF coil can reduce sample resistance significantly and improve SNR. Reducing the coil resistance or going to higher field strength can also improve SNR. For example, reducing the RF coil size and therefore the sample radius seen by the RF coil from 5 to 3 units (simply a 40% reduction in sample radius, $\sqrt{3125/243}$) results in a SNR change of 3.6 (360%). Further improvement can be realized with reduced sample and coil resistances and resulting increase in loaded Q values.

RF transmit chain electronics including the body coil can absorb power due to insertion losses and load mismatch, and both can result to a lower RF efficiency. At high voltages, these absorb significant power. For example, a 1 dB insertion loss results in roughly a 10% power absorption by the electronics. The MRI transmit chain consisting of the RF amplifier, duplexer and TR switches, if cooled, can preserve the RF efficiency (e.g., it will result in lower RF loss in the equipment, cables and associated circuitry). The body coil, if cooled, can minimize coil losses, improve the coil Q factor and therefore transmit coil performance. For example, a −3 dB attenuation translates to a 50% RF power amplifier reduction and therefore cost savings. For such a low RF power amplifier, additional savings can be realized with lower cooling needs. An efficient transmit chain with a loss-less RF coil is needed to reduce peak and average SAR in infants.

Conventionally copper RF coils are used in the industry. No effort is made to improve the RF coil performance with the use of advanced materials in comparison to the magnet wire(s) used in superconducting magnets. At present, the use of low, mid or high temperature superconducting material-based RF coils at present is limited due to design complexity, needs and use (e.g., direct human application). The same is true for liquid nitrogen cooled copper coils or other metal-based RF coils.

An unmet need to simplify RF coils in order to improve the RF transmit and receive efficiencies (e.g., to use low RF power, improve equipment performance, reduce SAR and improve SNR and imaging resolution) is necessary.

A device and method in accordance with the invention provide a safe, patient-centered diagnostic system that is in the best interest of the patient, user and hospital safety. A custom light-weight, liquid helium-free, cooled diagnostic imaging system with low fringe field, rapid ramping ability, high performance gradient and RF systems, specifically with a SAR efficient transmit system including high SNR imaging devices (RF coils) is described herein. Further integration and operation of the RF body coil with a cooled magnet-gradient combination or in an independent cooling configuration is possible with this invention.

According to an aspect of the invention, a pediatric magnetic resonance imaging (MRI) system is provided. The pediatric MRI system includes a radio frequency (RF) coil configured to image a portion of a patient. The pediatric MRI system also includes a cryo-cooling mechanism operatively coupled to the RF coil. The cryo-cooling mechanism is configured to maintain a temperature of the RF coil within a prescribed temperature range.

In an embodiment, the cryo-cooling mechanism of the pediatric MRI system directly contacts the RF coil.

In another embodiment, the cryo-cooling mechanism of the pediatric MRI system contacts at least one independent device arranged between the cryo-cooling mechanism and the RF coil. The at least one independent device directly contacts the RF coil.

In another embodiment, the cryo-cooling mechanism of the pediatric MRI system includes a non-conductive medium placed at close proximity to the RF coil.

In another embodiment, the cryo-cooling mechanism of the pediatric MRI system includes a non-conductive medium placed within the RF coil.

In another embodiment, the non-conductive medium is an insulator with a permittivity or dielectric constant in the range of 100-10,000.

In another embodiment, the cryo-cooling mechanism of the pediatric MRI system includes a thermally conductive medium in contact with the RF coil.

In another embodiment, the thermally conductive medium is a solid medium.

In another embodiment, the thermally conductive medium is a liquid medium.

In another embodiment, the thermally conductive medium is a gaseous medium.

In another embodiment, the pediatric MRI system includes a cooled magnet-gradient assembly. The cryo-cooling mechanism also includes at least one cooling channel bridging the cooled magnet-gradient assembly with the RF coil.

In another embodiment, the cryo-cooling mechanism is cryogen-free.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

FIGURES

In the annexed drawings, like references indicate like parts or features.

Figure 6A:
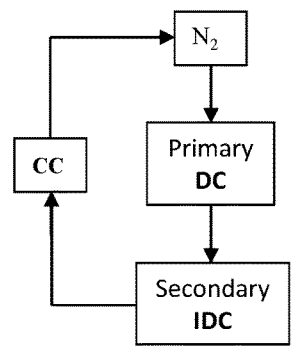
Figure 6B:
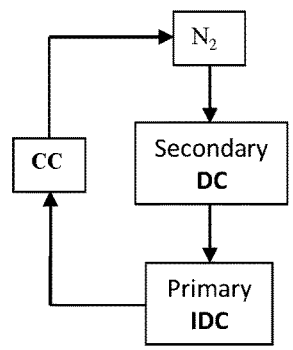
Figure 6C:
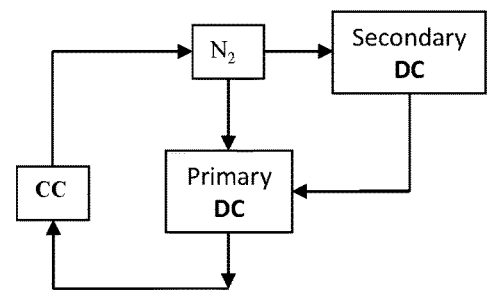

FIGS. 6A-C are block diagrams depicting variations of direct and indirect cooling schemes according to an aspect of the invention.

Figure 7A:
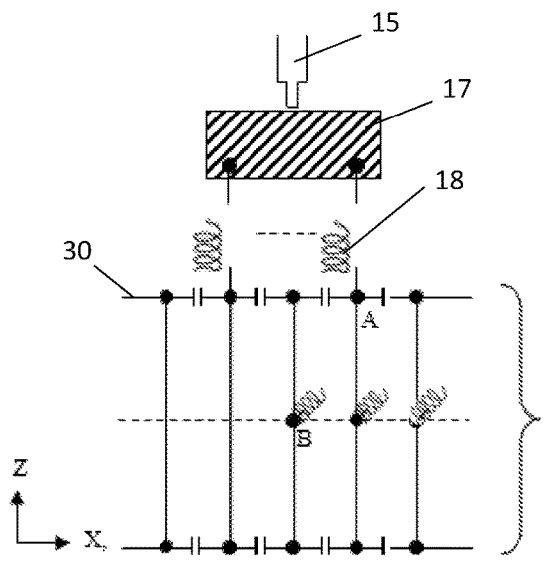
Figure 7B:
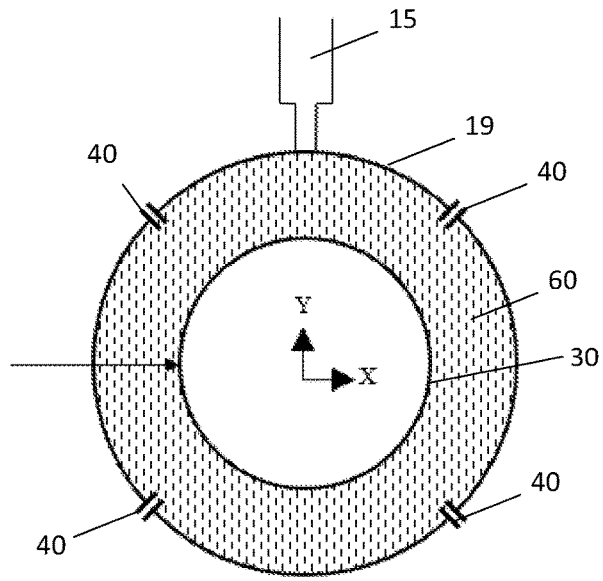

FIGS. 7A-B are schematic diagrams of direct and indirect cooling mechanisms using primary and secondary mechanisms applicable to volume RF coils according to an aspect of the invention.

Figure 8A:
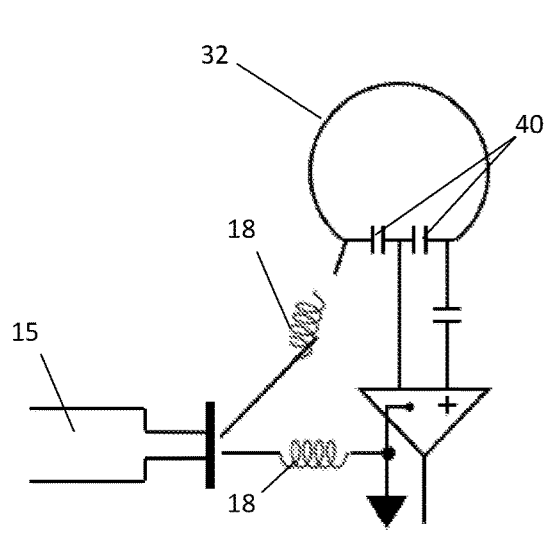
Figure 8B:
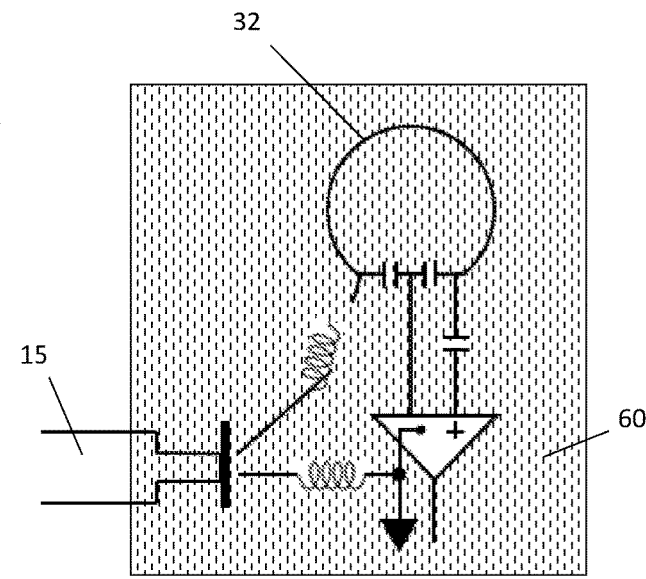
Figure 8C:
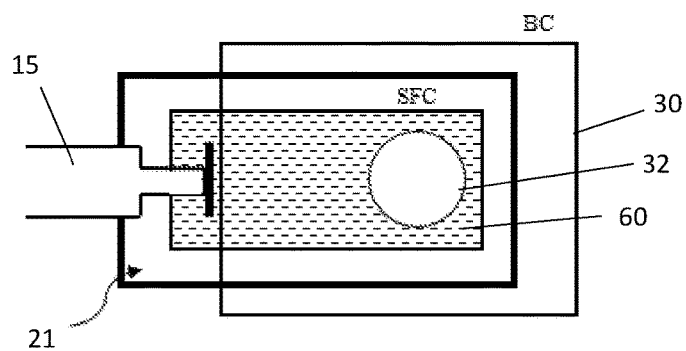

FIG. 8A-C are schematic diagrams of direct and indirect cooling mechanisms with primary and secondary mechanisms applicable to surface RF coils according to an aspect of the invention.

DESCRIPTION

Figure 1:
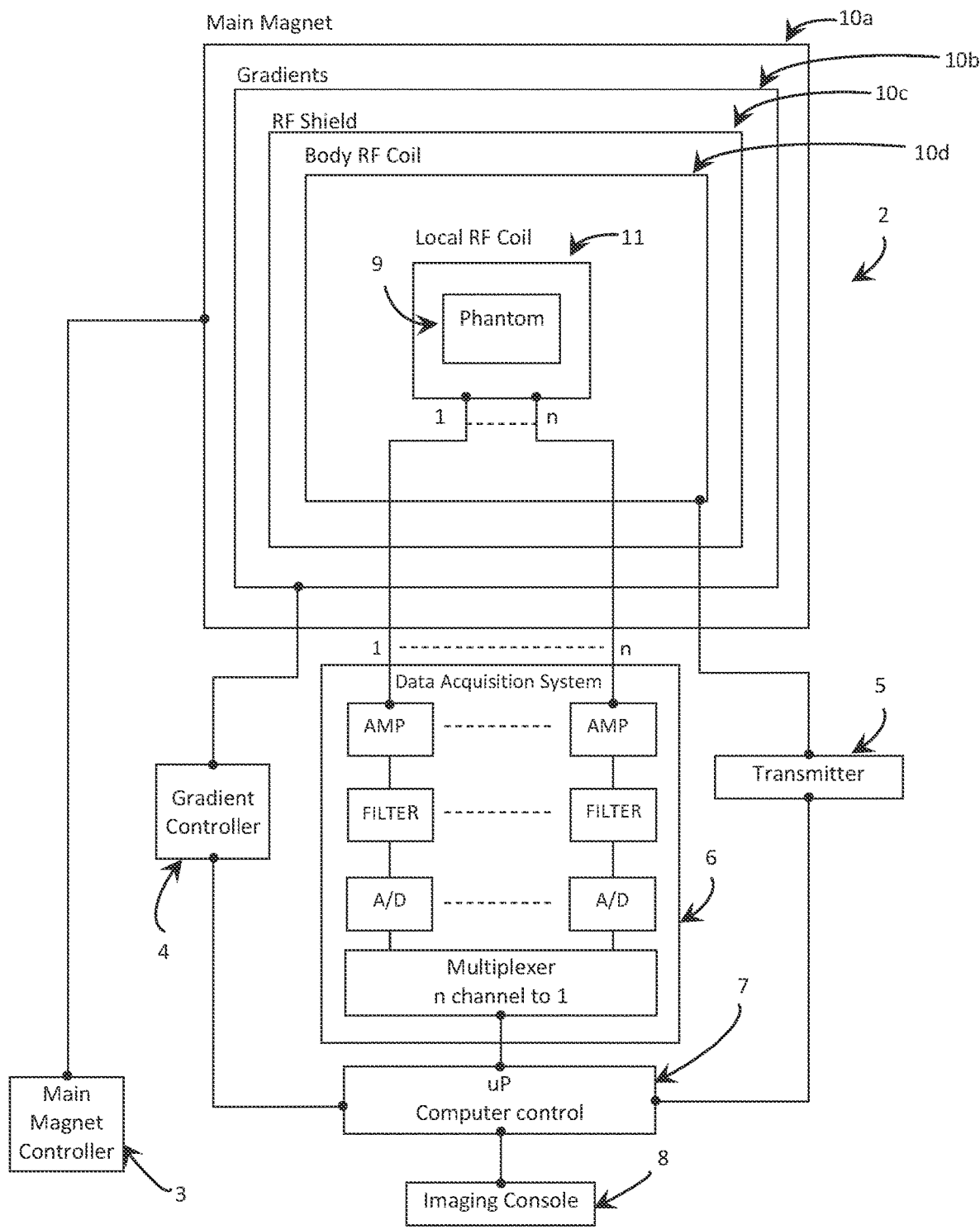
FIG. 1 is a block diagram of a conventional magnetic resonance diagnostic system.

With reference to FIG. 1, a block diagram of a conventional MRI diagnostic system 2 with a magnet 10a, room temperature shims (not shown), gradients 10b, RF shield 10c and body RF coil 10d is depicted. The body RF coil 10d defines an imaging volume consisting of at least one local RF coil array 11. An imaging phantom 9 is depicted in place of a human subject in the imaging volume of the MRI diagnostic system 2. The MRI diagnostic system 2 includes a main magnet controller 3, a gradient controller 4, a transmitter 5 and a data acquisition system 6, as is conventional. A computer controller 7 controls the operation of the system, and system data is provided to a user through an imaging console 8. The local RF coil array 11 sends and receives MRI data and control signals data to and from the data acquisition system 6.

Figure 2:
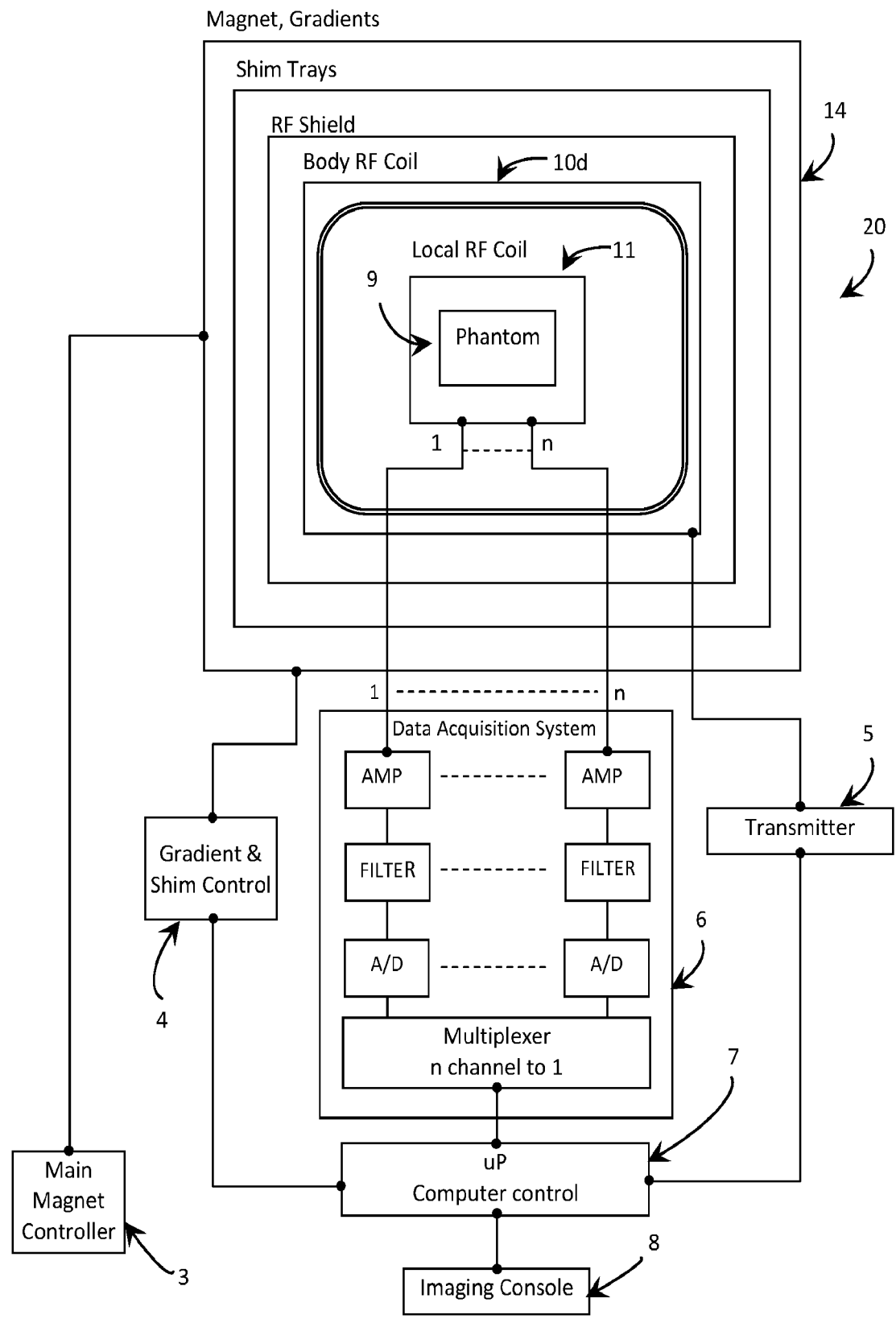
FIG. 2 is a block diagram of an exemplary magnetic resonance diagnostic system according to an aspect of the invention.

With reference to FIG. 2, a block diagram of an MRI diagnostic system 20 according to an aspect of the present invention is depicted. The MRI diagnostic system 20 of the present invention differs from that of FIG. 1 most notably in that it includes an integrated magnet-gradient assembly 14. As used herein, integrated magnet-gradient assembly is defined as a combination of an MRI magnet system and a gradient system. The combination of the MRI magnet system and the gradient system may be either in a common assembly or may include one system merged partially or wholly into the other system. In the embodiment depicted in FIG. 2, the MRI magnet system and the gradient system are merged in to one common assembly. The integration of the magnet and gradient assemblies simplifies the design and enhances system stability and performance with vibration-free, virtually noise-free, passive quenches. As MRI magnet systems are for static use (i.e., maintain steady magnetic field), MRI gradient systems are actively switched and therefore dissipate significant heat. Cooling the MRI gradients alone is impractical. Accordingly, the integrated magnet-gradient assembly 14 according to the present invention achieves a super-cooled MRI gradient with suitable enthalpy to support the integrated magnet-gradient operation. Further, the patient-centered MRI diagnostic system 20 of the present invention is in the best interest of the patient, user and hospital as it is light-weight, helium-free, and non-cryogen cooled. The MRI diagnostic system 20 also achieves low fringe field and rapid ramping ability.

As is conventional, the MRI diagnostic system 20 may also include shim assemblies and a body RF coil 10d including an RF shield (5 microns thick). The body RF coil 10d is preferably driven with one or more independent RF transmitters for a total power of roughly 8 kW at 3 T (128 MHz). The use of two or more 4 kW transmitters or four or more independent 2 kW transmitters with amplitude phase control is preferred. The body RF coil 10d defines an imaging volume which may include at least one local RF coil 11. The body RF coil 10d may be a transmit and/or receive body RF coil. The local RF coil 11 may include one or more local RF coils, such as for the brain, heart, spine, wrist, knee, etc., and may come in close contact with the patient for obtaining high signal to noise over the anatomy under investigation. The local RF coil 11 may also be a transmit and/or receive local RF coil. For example, the local RF coil 11 may include one or more single channel, transmit and/or receive RF coils. In another example, the local RF coil 11 may include one or more multi-channel, receive-only RF coils. An imaging phantom 9 is depicted in place of a human subject in the imaging volume of the MRI diagnostic system 20.

The MRI diagnostic system 20 includes a main magnet controller 3, a gradient controller 4, a transmitter 5 and a data acquisition system 6, as in the conventional MRI diagnostic system 2 of FIG. 1. A computer controller 7 controls the operation of the system, and system data is provided to a user through an imaging console 8. The local RF coil 11 sends and receives MRI data and control signals data to and from the data acquisition system 6. The presence of shim assemblies (e.g., passive and active) and a shim controller 4 allows homogenization of the main magnet field (making it uniform) over the anatomy of investigation, suitable for high resolution MR imaging and spectroscopy.

Figure 3A:
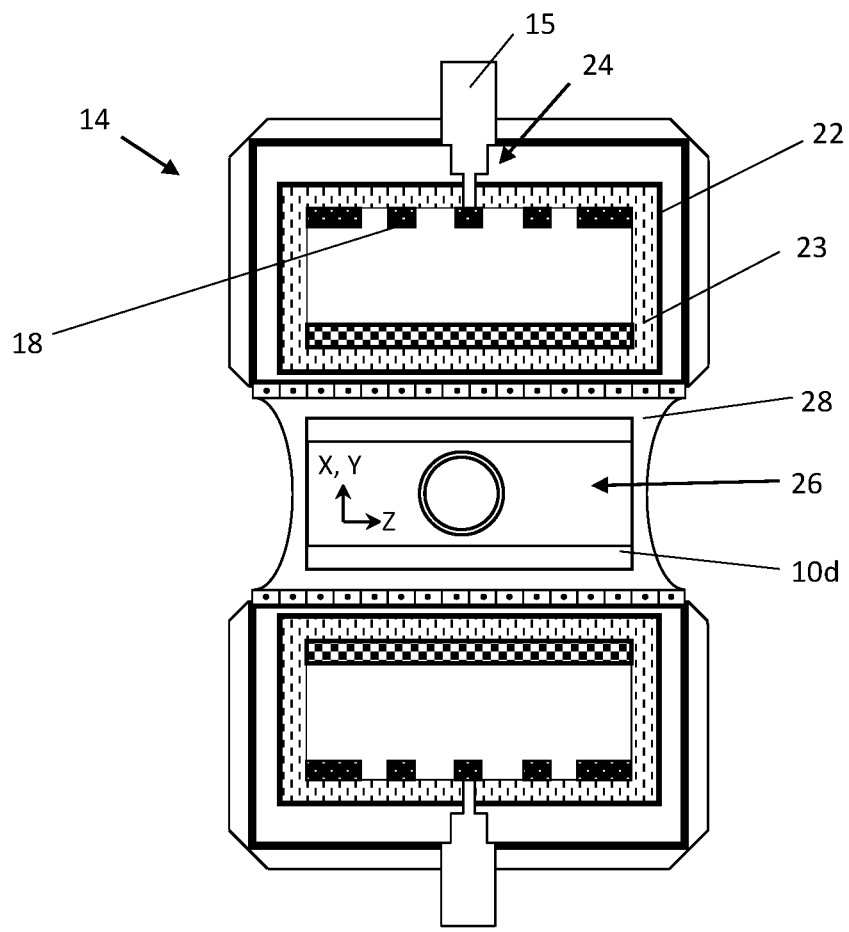
FIG. 3A is a side cross-sectional view of the magnet, gradients, RF shield, body coil and imaging volume of the exemplary magnetic resonance diagnostic system of FIG. 2.

With reference to FIG. 3A, a cross-sectional view of the integrated, light-weight, helium-free and non-cryogen cooled magnet-gradient assembly 14 of the pediatric MRI system 20 of FIG. 2 is depicted. By reducing an inner liner metal thickness in an inner chamber, which is preferably made of a glass filled plastic fiber composite material where the gradients and magnet coils reside, considerable eddy currents can be eliminated. The metal layer minimizes radiative losses, where a thinner metal layer results in lower eddy currents. The inner liner metal thickness may be reduced to be, for example, between 0.001 inches-0.1 inches.

The magnet-gradient assembly 14 of the MRI system 20 includes a conduction cooling system 24 for quickly detecting and resolving temperature rise in the magnet-gradient assembly 14. The magnet-gradient assembly 14 includes magnet coils comprising at least one superconducting wire 18, made of materials with high thermal conductivity to serve as a conduit for heat transfer (conduction cooling) between the magnet-gradient assembly 14 and the conduction cooling system 24. Use of copper, niobium-titanium or high temperature wire (for example, copper 400 W/m·K) with high current carrying density of 600 A/mm$^2$, for example, may be used. In an embodiment, use of copper, niobium-titanium or niobium-tin, low, mid (e.g., MgB$_2$) or high temperature superconducting (e.g., rare earth barium copper oxide ReBCO, bismuth-strontium-calcium-copper-oxygen BSCCO) wire with high current carrying density of 500 A/mm$^2$ or greater is preferred.

In an embodiment, the conduction cooling system 24 may include a cryogen-free cryo-cooler 15. As used herein, cryogen-free cryo-cooler is defined as a cryo-cooler that does not employ cryogens operating at −160° C. (e.g., liquid N2, liquid He, etc.). Rather, the cryogen-free cryo-cooler 15 uses, for example, a heat exchanger cooled with convection cooling (e.g., with air or water circulation) for cooling purposes. In a further embodiment, the conduction cooling system 24 may also include a host receptor 22 arranged within the magnet-gradient assembly 14 and cooled by the cryogen-free cryo-cooler 15. As used herein, a host receptor 22 is defined as an enclosure that houses the magnet and gradient systems of the magnet-gradient assembly 14 along with a cooling medium 23. A temperature of the superconducting wire 18 necessary to sustain the main magnetic field is held steady by the cooling medium 23 in the host receptor 22. The cooling medium 23 in the host receptor 22, therefore, may have very low specific heat, for example, ranging from 0.005 to 0.05 J/g·K. In an embodiment, the cooling medium 23 in the host receptor 22 may have a specific heat of, for example, 0.02 J/g·K. The host receptor 22 may be held in a vacuum to substantially isolate the cooling medium 23 of the host receptor 22 and temperature of the magnet and gradient systems (4-30K) from the ambient room temperature of 25° C. One or more cooling mediums 23 with different heat capacities may be used in combination within the host receptor 22.

The mass of the host receptor 22 may be capable of maintaining system enthalpy over a predetermined time period (e.g., to provide high latency to sustain main magnet temperature and the resulting magnetic field during a brief interruption or power disturbances). That is, the host receptor 22 may have substantial mass to ensure steady state superconducting wire 18 temperature in a safe operating zone (below critical [maximum] temperature cutoff $T_c$ for a superconducting wire 18) necessary to maintain a stable magnetic field. Infant size magnet-gradient assemblies, however, occupying roughly half to a third of the adult scanner volume can require lower heat capacity in the order of 500-1,000 KJ/Kg.

According to an aspect of the invention, a high-enthalpy host receptor 22 housing a cooling medium 23 of liquid nitrogen and at least part of the magnet-gradient assembly 14. The host receptor 22 may operate anywhere between 4-99° K and may be covered with a 0.001-0.060" thick metal. The host receptor 22 may be conduction cooled with a 1-4 W cryogen-free cryo-cooler 15 and held in vacuum to isolate the host receptor from the ambient room temperature. The cooling medium 23 may include primary and secondary cooling mediums 23 with a specific heat of ≥50 J/Kg·° K and a total heat capacity anywhere between 500-1,000 J/Kg at 10-20K. The host receptor 22 is sufficient to maintain a stable operating temperature for magnet-gradient assembly 14 coil operation, resulting in a stable magnet and gradient field over an imaging volume 26. The mass of the host assembly 22 can provide sufficient inertia to enable field switching or ramping to higher field strength up to a prescribed limit or de-ramping to a lower magnetic field for enhanced safety or other purposes without affecting magnet integrity or propagating a magnet quench.

A passive shim liner with a plurality of symmetric trays and a plurality of small pieces of steel distributed along each tray length from front to the back of the magnet-gradient assembly 14 inside the main magnet bore homogenizes the main magnetic field over the imaging volume 26. Conventional circular and elliptical cross-section magnets maintain two-axes symmetry (e.g., in four quadrants), and are therefore preferred to have a total number of trays divisible by four. Accordingly, the magnet gradient assembly 14 according to the present invention may have thirty-two, forty-eight, sixty-four, etc. . . . trays and a number of small pieces of steel within each tray ranging from sixteen to one hundred twenty-eight pieces, depending on the level of control needed to homogenize the main magnet field along the magnet-gradient assembly axis (Z).

The cooling concept in accordance with the invention applies to any electromagnet, operating in resistive, quasi-resistive or superconducting manner or their combination for medical or non-medical applications not limited to electron paramagnetic resonance (EPR), electron spin resonance (ESR), nuclear magnetic resonance (NMR) or other techniques utilizing supercooled magnets. One or more shim trays 28 can be used, or a single tray 28 can be further sub-divided to homogenize field strength at one or more field strengths (e.g., 3 T and 1.5 T).

Figure 3B:
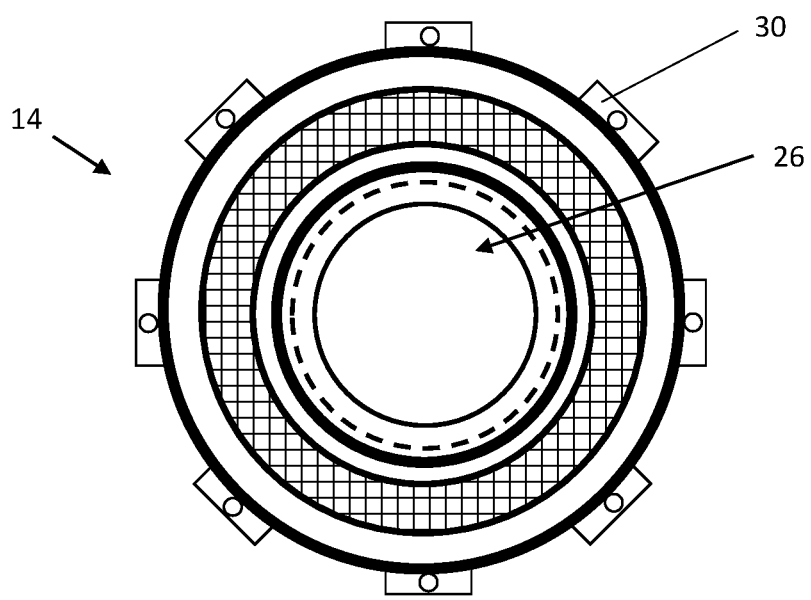
FIG. 3B is a front cross-sectional view of the magnet, gradients, RF shield, body coil and imaging volume of the exemplary magnetic resonance diagnostic system of FIG. 2.

With reference to FIG. 3B, small pieces of ferromagnetic or diamagnetic materials 30, preferably iron yoke or steel, may be lined outside the magnet-gradient assembly 14 (<25% of the main magnet weight). The ferromagnetic or diamagnetic materials 30 capture the flux extending out of the magnet-gradient assembly 14 volume and return the flux back to the magnet-gradient assembly 14. This is done to preserve the system magnetic flux or magnetic field energy without significantly diminishing the magnetic field strength over the imaging volume 26 while exhibiting minimum interaction with neighboring equipment.

The magnet-gradient assembly 14 inner bore diameter (excluding the RF body coil 10*d*) may be 30-50 cm and the magnet-gradient assembly 14 outer diameter may be 80-140 cm. The magnet-gradient assembly 14 may operate between 1.5 T-4 T. The gradient design may be either a "thumb print" minimum inductance as taught by Turner et al. (Turner, R. Comparison of minimum inductance and minimum power gradient coil design strategies. In: Book of abstracts: Eleventh Annual Meeting of the Society of Magnetic Resonance in Medicine. Berkeley, Calif.: ISMRM, 1992: 4031) or others. First order shimming of the main magnet field is possible by superimposing small fields over the gradient fields to further homogenize the field over the imaging field of view (FOV). The overall weight of the magnet-gradient assembly 14 may be 600-1,000 Kgs, distributed over a 3'×5' floor footprint. Accordingly, the MRI diagnostic system 20 of the present invention simplifies the cooled magnet-gradient assembly 14 into one light-weight structure capable of rapid ramping and safe operation in one or more field strengths, in a stable manner. The magnet-gradient assembly 14 of the present invention achieves <½ the weight of the 2 Ton prior art magnet assemblies and, due to enhanced magnet operation, achieves at least three times the field strength, making it highly suitable for enhanced diagnosis in a shorter exam time.

The MRI diagnostic system 20 according to an aspect of the present invention is configured to achieve optimum, maximum SNR as will be described herein. Optimum, maximum SNR may be achieved by improving signal and reducing noise by cooling the body RF coil and/or the local RF coils, as will be described in detail below. In an embodiment, dielectric material may be added to the coil volumes.

As previously mentioned, SNR $\alpha$ $\sqrt{Q}$. Accordingly, a higher loaded Q will result in a higher SNR. Higher Q's can be realized with smaller coil loops. However, with smaller coil loops coil noises start to dominate, resulting in lower SNR since total noise is a combination of sample, coil and electronic noises. SNR can be increased by increasing the signal or reducing noise. An RF coil with inductance L, resonating with a capacitance C, has a frequency of resonance that can be expressed as $f=1/2\pi\sqrt{LC}$. Q, the quality factor of an RF coil in terms of circuit elements can be expressed as $Q=\omega L/R$, where R is the circuit resistance including the RF coil. Q can also be defined based on the energy stored versus that lost per cycle as $Q=2\pi\times$Energy stored/Energy loss per cycle; $Q=f/\Delta f$, where $\Delta f$ is the frequency bandwidth of the resonant circuit. Q can be measured in free space (e.g., air) and with a phantom, animal or human loading the resonant coil. Empty coil Q will be higher than loaded Q, since body losses dominate with respect to the losses in the RF coil circuit. Q loaded will be lower since it includes the conductive sample (lossy sample).

The total resistance of the coil circuit will be a combination of the sample resistance and the RF coil resistance. The sample resistance depends on the loading, based on its proximity to the resonating RF coil. For a given phantom geometry and fixed location, loaded Q is reproducible with the help of a network or spectrum analyzer. The comparison between the ideal amount of noise and noise included from the RF coil is given by the equation:

$$\text{noise power ratio} = \frac{Rs + Rc}{Rc} = \frac{\frac{Q_{empty}}{Q_{loaded}}}{\frac{Q_{empty}}{Q_{loaded}} - 1}$$

For example, when $Q_{empty}/Q_{loaded}=5$, the noise power ratio will be 1.25 (5/4=1.25) or 0.97 dB (10 $\log_{10}$ 1.25). Thus, the intrinsic resistance of the copper in the RF coil contributes an extra 25% noise power and decreases the SNR by 25% (amplitude SNR by 12% [$\sqrt{1.25}$]). This extra noise contribution can be minimized to an extent according to aspects of the present invention, as will be described below. This is analogous to a 0.5 dB noise figure preamplifier which contributes an extra 12% noise power. There may be other circuits in between that have insertion loses, such as the matching circuit, coaxial cable baluns and low Q inductors used in the circuits, which may add to the losses in an RF receiver chain.

For an RF receiver chain with three gain stages, for example, the total noise factor can be found with Friis' Formula:

$$= N1 + \frac{N2-1}{G1} + \frac{N3-1}{G1G2},$$

where N1-N3 and G1-G3 are noise figures and gains, respectively, for the three individual stages. The first amplifier in a chain (preamplifier in the RF coil) usually has the most significant effect on the total noise figure because the noise figures of the following stages are reduced by stage gains. Consequently, the first amplifier usually has a low noise figure, and the noise figure requirements of subsequent stages are usually more relaxed. It has been found that if the first RF receiver gain be roughly a third or more of the total receiver gain, the noise figure of the entire chain, and therefore the overall SNR, may be preserved. Since the first gain of the receiver chain is in the RF coil, the noise figure (NF) for the entire receive chain can be optimized with a low RF coil preamplifier NF (eg. 0.1-0.5 dB).

An MRI signal obtainable from an object is fixed for a given RF coil design, imaging sequence and field strength. To further maximize SNR performance, the circuitry noises may be reduced to a minimum and preferably almost to zero, although they cannot be eliminated entirely. Roughly 50% RF power loss has been seen, for example, in pediatric head RF coils operating at 1.5 T and 3 T by performing unloaded and loaded Q measurements and verifying with MRI calorimetry experiments. With a highly efficient transmit RF coil operating at roughly 3 dB power (or half power) and based on reciprocity, nearly 40% SNR enhancement over the imaging field of view (FOV) can be realized, which is a significant improvement. For example, SNR improvements of 40±5% on a pediatric head coil at 1.5 T (64 MHz) and 3 T (128 MHz) may be realized.

As the $Q_{empty}/Q_{loaded}$ ratio approaches close to 1 (e.g., as coil losses dominate), even greater enhancements may be realized irrespective of the frequency of operation. With the introduction of parallel transmit RF applications, shrinking individual body coil sizes favor cooling since the $Q_{empty}/Q_{loaded}$ ratios will approach unity (normally <5 instead of the present 10-15). This is because sample losses slowly diminish as each transmit coil covers smaller anatomy and as coil losses begin to rise.

Since human loading represents a lossy sample (lower $Q_{loaded}$ values), it dominates the noise at higher frequencies. By using smaller RF coils, the human loading effect may be significantly minimized but not eliminated entirely, and the coil losses virtually eliminated with increased signal induction (e.g., efficient RF coil) with cooling, all concomitantly enhancing SNR. The standards applicable to optimum SNR approaching intrinsic values in room temperature air may no longer be applied to cooled RF coils. That is, room temperature air coil designs, when cooled, may not be optimum for a cooled RF coil design, and vice versa. Because coil losses are virtually eliminated with cooled RF coils, new RF coil designs may be suitable.

SNR may be improved by reducing the noise from the lossy human sample with the use of a loading solution closer to the RF coil. The human loading effect, though not eliminated entirely, may be further altered to an extent with the help of a conductive ($\sigma \leq 15$ mS/cm) or non-conductive (insulator with permittivity or dielectric constant for example in the range of 100-10,000, with low loss-tangent <0.01) medium placed within or at close proximity to the RF coil. In one embodiment the conductive medium is placed between the RF array and the human anatomy under investigation. This way the conductive medium noise dominates and little noise is received due to human loading mainly due to reduced electric fields over the human subject.

The conductive or non-conductive medium may be cooled by any mechanism intended to reduce the thermal noise, thereby enhancing SNR, since noise power is proportional to temperature ($Vn^2 \propto T$). Choice of an appropriate conductive medium is important because as the temperature changes, so does phase and conductivity. For example, the conductivity of a preferred 0.9% NaCl (hospital saline solution), which has a conductivity of 12 mS/cm at 20° C., reduces to 4 mS/cm at 0° C. and increases to 6 mS/cm at −20° C. Accordingly, the effect of any given conductive or non-conductive medium varies with frequency, coil design and the human application, however optimization is achievable for an application-specific coil design.

Figure 4:
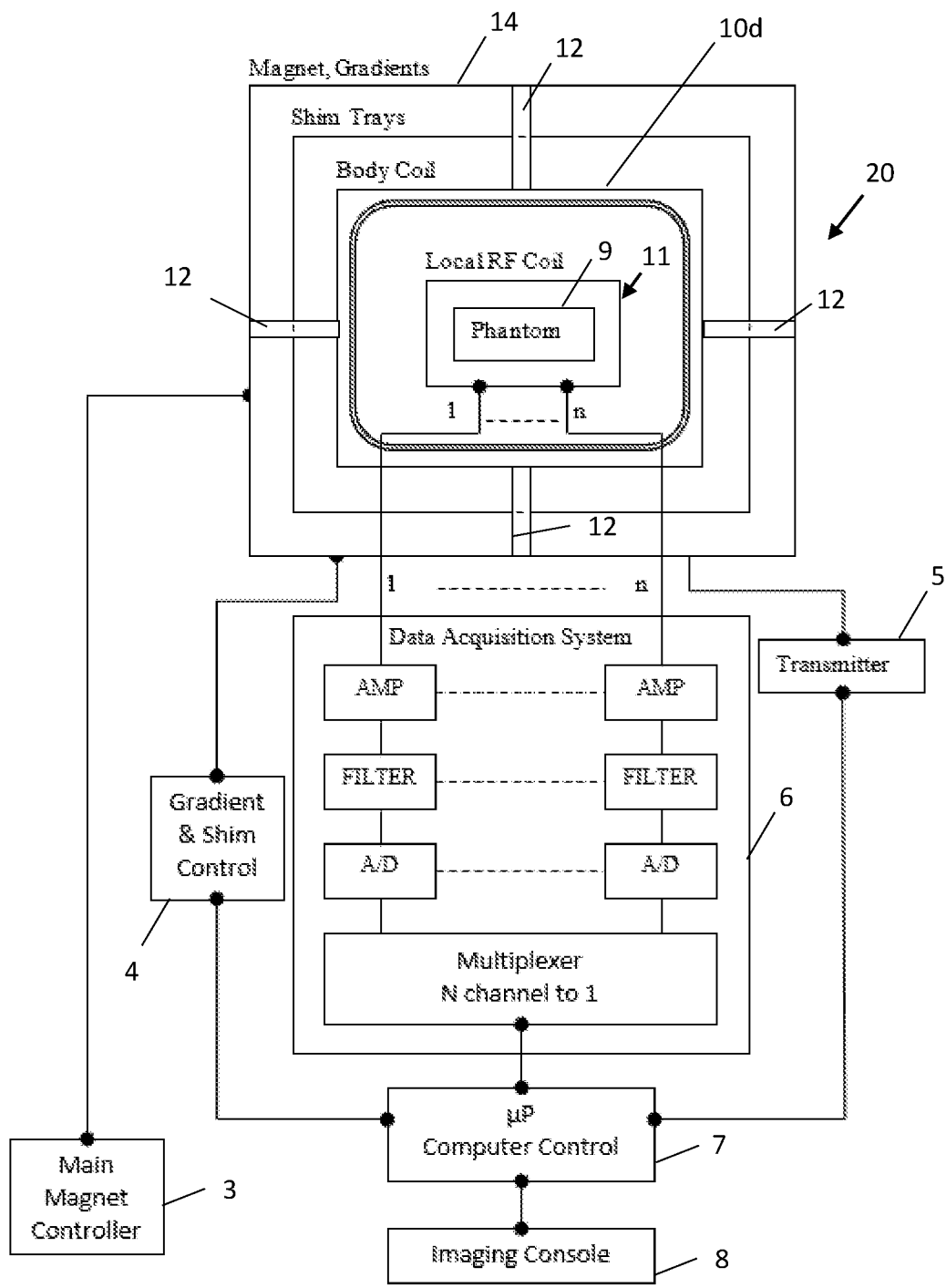
FIG. 4 is a block diagram of another exemplary magnetic resonance diagnostic system according to an aspect of the invention.
Figure 5A:
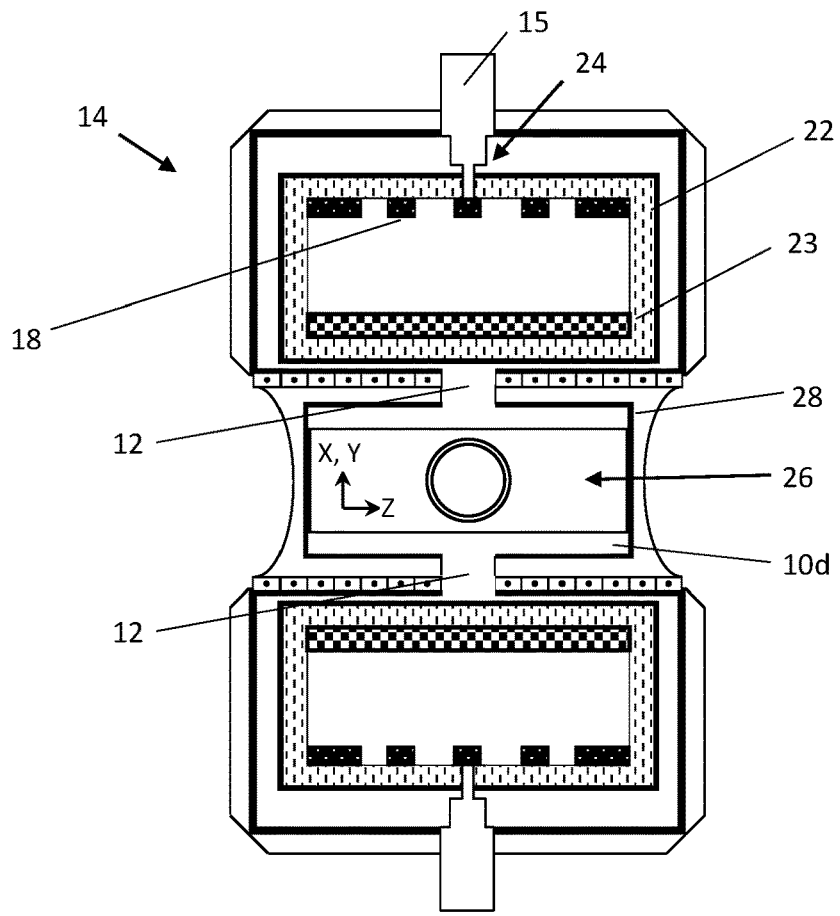
FIG. 5A is a cross-sectional view of the magnet, gradients, RF shield, body coil and imaging volume of the exemplary magnetic resonance diagnostic system of FIG. 4.
Figure 5B:
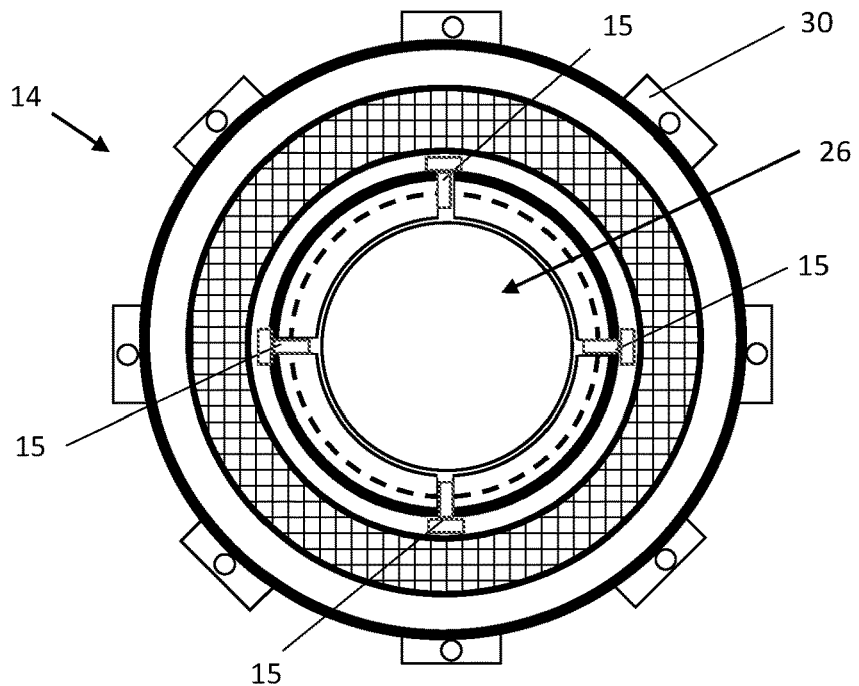
FIG. 5B is a front cross-sectional view of the magnet, gradients, RF shield, body coil and imaging volume of the exemplary magnetic resonance diagnostic system of FIG. 4.

In another embodiment, and with reference to FIGS. 4 and 5A, the body RF coil 10d may be incorporated into the cooled magnet-gradient assembly 14 of the exemplary MRI diagnostic assembly 20 with one or more cooling channels 12. The cooling channels 12 between the body RF coil array 10d and the magnet-gradient assembly 14 are intended to bridge the RF coil array 10d and the magnet-gradient assembly 14 for cooling purposes. FIG. 5A depicts a cross-sectional side view of the MRI diagnostic assembly 20 of FIG. 4 with the one or more cooling channels 12 therein. In another embodiment depicted in FIG. 5B, showing a cross-sectional front view of the MRI diagnostic assembly of FIG. 4, an independent cryogen or cryogen-free cryo-cooler 15 may cool the body RF coil 10d separately from the magnet-gradient assembly 14. Although these two embodiments of the exemplary MRI diagnostic system 20 are depicted, it is to be understood that other configurations may be possible. For example, factors such as ease of service may determine which configuration is preferred for any given application.

Direct cooling and/or indirect cooling mechanisms of the body RF coil 10d may be achieved with the help of the independent cryo-cooler 15 and/or conduction or convection cooling mechanism to draw heat from the body RF coil 10d and supply a cooled solid, liquid or gaseous medium 60 to the body RF coil 10d. For example, a solid medium may be used for conductive cooling of the body RF coil 10d by direct physical contact with the body RF coil 10d and the host receptor 22. Direct cooling with direct contact to the body RF coil 10d is possible with the help of one or more independent device such as one or more isolators (e.g., RF chokes, filters etc. . . . ), without shorting the circuit to RF or DC ground without a load. The use of RF chokes and filters may provide means of electrical isolation to avoid any possible interactions, for example, with the gradients operating at intermediate frequencies (IF) and he transmit-receive coils operating at radio-frequencies (RF) for the cooling mechanisms, in short with the MRI system. Alternatively, a solid medium may be used for conductive cooling by indirect contact via a thermally conductive plastic with an electrical insulator. In another example, a liquid medium, such as liquid nitrogen and/or a secondary medium that is thermally conductive but also an electric insulator (e.g., synthetic esters, silicones, polymers, advanced materials) may be used. In another example, a gaseous medium, such as helium gas (or nitrogen, carbon-dioxide, argon etc. . . . ) with a low pressure, closed-loop refrigeration style cooling system suitable for low temperature operation in order to prevent rapid boil off may be used. The gaseous medium and cooling system may be suitable for low temperature operation in order to prevent rapid boil off. Employment of direct and/or indirect cooling of the body RF coil 10d may provide consistent safe operation and maintain prescribed temperatures essential for optimum body RF coil 10d performance (e.g., maintain the coil temperature within a prescribed temperature range).

With reference to FIGS. 6A-6C, three schemes for direct cooling (denoted in the figure as "DC") and indirect cooling (denoted in the figure as "IDC") with primary and secondary cooling mechanisms and using a cryo-cooler (denoted in the figure as "CC") are depicted. In FIG. 6A, a substance, such as $N_2$, may be in direct contact with the RF coil and therefore may serve as a primary direct cooling mechanism. The cryo-cooler may then be indirectly cooling the RF coil through direct contact with the $N_2$ and may therefore be a secondary indirect cooling mechanism. Alternatively, in FIG. 6B, a different substance may be in direct contact with the RF coil and may serve as the primary direct cooling mechanism. The $N_2$ however may serve as a secondary direct cooling mechanism that directly cools the primary direct cooling mechanism. The cryo-cooler then is the primary indirect cooling mechanism, as it cools the secondary direct cooling mechanism (e.g., the $N_2$). FIG. 6C depicts yet another embodiment in which the mechanism depicted in FIGS. 6A and 6B are combined. It is to be understood that these and other configurations and/or their combinations are possible to achieve cooling of either of the magnet, gradients, body RF coil or other RF coil arrays and/or other circuitry. It is also to be understood that liquids or gases other than $N_2$ may be used as appropriate for the intended application. Specific examples of direct cooling and indirect cooling mechanisms, and their combination, are discussed for volume body RF coils and surface RF coils in FIGS. 7 and 8, respectively.

Referring to FIG. 7A, a birdcage type volume body RF coil 30 of a volume body RF coil array is shown in an open planar configuration as a ladder structure for ease of discussion. In operative form, the ladder structure wraps around the cylinder with the end rings connected to form a volume coil. A direct conduction cooling mechanism may be achieved by the cryo-cooler 15 contacting the volume body RF coil 30 via a common guard ring 17. The guard ring 17 serves to provide a combined RF shielding and a grounding structure around the body RF coil 30 to which cables can be routed with minimal shield currents. RF chokes 18 (two depicted) can be connected to the guard ring 17 and the RF body coil 30. The common guard ring 17 simplifies the cooling process by permitting contact with multiple points ("A") on the birdcage rungs (straight segments that are distributed azimuthally around the cylinder). Alternatively, central virtual RF ground points ("B") on the birdcage (along the dotted line representing the virtual RF ground plane) may be connected to the cryo-cooler 15. Connection to virtual RF ground points B eliminate unnecessary ground loops that may be formed which may affect the volume body RF coil 30 performance. Though direct contact with the virtual RF ground points B is possible without RF chokes 18, the use of RF chokes 18 is preferred due to component tolerances and asymmetric human loading effects, which may alter the precise location of these virtual RF ground points B. A small shift in virtual RF ground points B may cause small amount of RF currents to pass to ground, which in turn may affect the volume body RF coil 30 performance.

Connections may be simplified further with the configuration depicted in FIG. 7B. In the embodiment depicted in FIG. 7B, the cryo-cooler 15 contacts an RF shield 19 of the volume body RF coil 30. Via the RF shield 19, the cryo-cooler 15 indirectly contacts the volume body RF coil 30 at points A or B, as depicted in FIG. 7A, without affecting the volume body RF coil 30 performance. The embodiment of FIG. 7B also includes the cooled solid, liquid or gaseous medium 60 in between the RF shield 19 and the volume body RF coil 30, similar to the magnet-gradient assembly of FIG. 3, to accelerate the cooling process and maintain stability. As depicted, the RF shield 19 may broken with RF shorting capacitors 40 to minimize eddy currents. Alternately the RF shield 19 may be made with a very thin continuous mesh or sheet, or other design embedded in the sheet or mesh. Though the embodiments shown in FIGS. 7A-B are described with respect to the volume body RF coil 30, the inventive features may readily be applied to surface RF coils as well.

FIG. 8A depicts direct cooling of a simple surface RF coil 32 used for transmitting or receiving MRI signals. One or more of such surface RF coils 32 may be used for MRI signal acquisition. The loop surface RF coil 32 includes tuning and matching capacitors 40, having a low-noise figure (<0.5 dB), high-gain (~30 dB) preamplifier with RF chokes 18 that connect to the cryo-cooler 15. The RF chokes 18 are used to isolate the surface RF coil 32 from the surrounding environment in order to preserve performance. Though only two connection points of the RF chokes 18 to the surface RF coil are shown, it is to be understood that one or more points may be used to maximize the cooling efficiency without substantially compromising the surface RF coil performance.

As the receiver coils are close to the subject of investigation and are inside the body coil transmit field of view (FOV), care must be taken to keep the metal head of the cryo-cooler 15 away from the imaging volume. In an embodiment, depicted in FIG. 8B, a combination of direct and indirect cooling of the surface RF coil 32 is depicted. The surface RF coil 32 may be embedded (surrounded) in the cooled solid, liquid or gaseous medium 60 and the cryo-cooler 15 may be located away from the imaging volume. Alternatively, hoses may be extended from the cryo-cooler 15 to the surface RF coil 32 in addition to the conduction-cooling and the cooled solid, liquid or gaseous medium 60 based cooling mentioned above. Though not depicted, the hoses may be attached to a remote cryo-cooler 15 to carry the cooled solid, liquid or gaseous medium 60 to the surface RF coil 32. In this way, the metal components of the cryo-cooler 15 may be kept away from the body coil FOV such that the transmit field may be unaffected. Also, the metal components of the cryo-cooler 15 may be kept away from the gradient field-of-view so the gradient performance presents very little to no MRI artifacts. For additional protection, a vacuum chamber or other mechanism may be employed in or around the surface RF coil 32 to minimize the boiling and effectively isolate the cooled environment from the ambient temperature and the subject.

FIG. 8C depicts an indirect cooling arrangement with respect to the body transmit coil for the receiver surface coil (less electronics). Note this mechanism can be used for the transmit coils or their combination. A middle layer vacuum 21 is also shown for improved isolation. In this embodiment, the cooled solid, liquid or gaseous medium 60, although shown to cover the surface coil, is left out inside the coil volume. This can suit applications where the coil encompasses the anatomy, for example over the fingers, wrist or forearm, ankle, knee etc. Though the embodiments shown in FIGS. 8A-C are described with respect to the surface RF coil 32, the inventive features may readily be applied to body coils as well.

Receive signals are digitized either on the coil or remote from the magnet prior to signal combination. Analog, digital, optical or other means may be employed in the receiver chain. Processing and post-processing can be hosted on the imaging console or on separate consoles. Scanner electronics can be placed in a 4'×6' area, whereas the imaging operator console can be placed in a 3'×5' area close to the main magnet. Thus, the space required for the pediatric sized MRI diagnostic system according to aspects of the present invention is well within 15'×15'. Use of liquid helium free supercooled integrated magnet-gradient design is preferred to reduce weight, overall size including siting considerations. Integrated RF shield-RF coil with parallel imaging options is intended to optimize the RF power expended in a MRI experiment and thus reduce peak and local SAR. It is to be understood that different RF array designs and arrangements are possible.

Narrow and broad band filtering schemes over the NMR spectrum, shielded coaxial cables, better grounding, etc. . . . and double faults are included to reduce EMI/EMC radiation (per IEC 60601-1-2), eliminate undesired harmonics, minimize risks of high voltage exposure while maintaining leakage currents below the required IEC guidelines for medical equipment for safe operation (IEC 60601-1). All of the MRI compatible equipment and accessory (ventilator, monitor, infusion pump, IV bag, oxygen/air tanks, pressure reducers, flow tubes, etc. . . . ) are held on to the mobile MRI patient table and safe to enter the MRI exam suite, whereas non-magnetic and MR unsafe accessory are removed from the mobile MRI table. In the best interest of saving the gases remaining in the MR conditional tanks, quick connect-disconnects are provided to switch over between the gas tanks and central hospital gas supply in a matter of seconds.

Close proximity to the subject enhances SNR due to higher filling factors. Parallel imaging compatible RF array coils further enhance image quality. Parallel transmit capability can lead to reduction of peak and average SARs over infants. Other coil combinations, such as a knee coil, head only coil, wrist coil, abdomen coil, etc. . . . can be realized for use with the MRI scanner and an isolette. This inventive cooling concept applies to any electromagnet, operating in resistive, quasi-resistive or superconducting manner or their combination for medical or non-medical applications and not limited to EPR, ESR, NMR or other techniques utilizing supercooled magnets. Operating the magnet in one or more field strengths can be beneficial to performing suited experiments at the respective field strengths (e.g., brain MRI at higher field strength and hyper-polarized xenon or helium lung MRI at the lower field strengths). Alternatively leaving the magnet at low field after clinical or research use may be beneficial to enhance safety or to allow cleaning personnel or to conserve power. Modifications to the magnet, gradients, shims, RF shield, MRI, transmit chain originating from the transmit body coil, receive chain originating from the local imaging devices, direct or indirect warming systems, support equipment and accessory are plausible after reading this application.

Advantages of the device in accordance with the present invention include that an SAR efficient RF transmission patient-centered diagnostic imaging system with additional life sustaining and monitoring accessories is provided. The device provides optimum reception of MRI signals and a small footprint. The device is suitable to receive any mild, moderate or severely ill pediatric patient and provide very high SNR for optimum care and diagnosis. The device in accordance with the present invention also permits full body infant imaging without restrictions to patient care equipment, diagnostic imaging equipment, and accessories. The device is thereby capable of providing uncompromised clinical care as a result of evidence-based diagnosis or prognosis at or the near the onset of infant illness.

The infant specific technology described herein may be readily applied to human and non-human uses. Although the invention has been shown and described with respect to a certain embodiment or embodiments, equivalent alterations and modifications may occur to others skilled in the art upon the reading and understanding of this specification and the annexed drawings. The present invention includes all such equivalents and modifications. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein exemplary embodiment or embodiments of the invention. In addition, while a particular feature of the invention may have been described above with respect to only one or more of several embodiments, such feature may be combined with one or more other features of the other embodiments, as may be desired and advantageous for any given or particular application.

The invention claimed is:

1. A pediatric magnetic resonance imaging (MRI) system, comprising:
   a radio frequency (RF) coil configured to image a portion of a patient; and
   a cryogen-free cooling mechanism operatively coupled to the RF coil, the cryogen-free cooling mechanism configured to maintain a temperature of the RF coil within a prescribed temperature range, wherein the cryogen-free cooling mechanism comprises a cooling medium having a specific heat greater than or equal to 50 J/Kg °K,
   wherein the cryogen-free cooling mechanism employs direct cooling of the RF coil and indirect cooling of the RF coil,
   the direct cooling comprising a first cooling medium cooled by the cryogen-free cooling mechanism, the first cooling medium being in direct contact with the RF coil, and
   the indirect cooling comprising a second cooling medium cooled by the cryogen-free cooling mechanism, the second cooling medium being in indirect contact with the RF coil, the second cooling medium different from the first cooling medium, the second cooling medium being one of a solid, a liquid, or a nitrogen gas.

2. The pediatric MRI system according to claim 1, wherein the cryogen-free cooling mechanism contacts at least one independent device arranged between the cooling mechanism and the RF coil, the at least one independent device directly contacting the RF coil.

3. The pediatric MRI system according to claim 1, wherein the cryogen-free cooling mechanism includes an electrically non-conductive medium placed at close proximity to the RF coil.

4. The pediatric MRI system according to claim 3, wherein the non-conductive medium is an insulator with a permittivity or dielectric constant in the range of 100-10,000.

5. The pediatric MRI system according to claim 1, wherein the cryogen-free cooling mechanism includes an electrically non-conductive medium placed within the RF coil.

6. The pediatric MRI system according to claim 1, wherein the cryogen-free cooling mechanism comprises a thermally conductive medium in contact with the RF coil.

7. The pediatric MRI system according to claim 6, wherein the thermally conductive medium is a solid medium.

8. The pediatric MRI system according to claim 6, wherein the thermally conductive medium is a liquid medium.

9. The pediatric MRI system according to claim 6, wherein the thermally conductive medium is a gaseous medium.

10. The pediatric MRI system according to claim 1, further comprising a cooled magnet-gradient assembly, wherein the cryogen-free cooling mechanism comprises at least one cooling channel bridging the cooled magnet-gradient assembly with the RF coil.

11. The pediatric MRI system according to claim 1, further comprising:
   a gradient coil configured to generate a gradient field; and
   a plurality of channels disposed between the RF coil and the gradient coil, the plurality of channels configured to provide a cooling bridge between the RF coil and the gradient coil.

* * * * *